United States Patent [19]

Mazzucco et al.

[11] Patent Number: 5,258,723

[45] Date of Patent: Nov. 2, 1993

[54] INTEGRATED INSTRUMENTATION AMPLIFIER WITH INTEGRATED FREQUENCY-COMPENSATING CAPACITANCE

[75] Inventors: Michelangelo Mazzucco, Santa Maria del Tempio; Vanni Poletto, Camino; Marco Morelli, Livorno, all of Italy

[73] Assignee: SGS-Thomson Microelectronics, S.R.L., Agrate Brianza, Italy

[21] Appl. No.: 919,991

[22] Filed: Jul. 27, 1992

[30] Foreign Application Priority Data

Jul. 29, 1991 [IT] Italy .................. TO91A000598

[51] Int. Cl.⁵ .............................................. H03F 3/45
[52] U.S. Cl. ...................................... 330/258; 330/259; 330/260; 330/294
[58] Field of Search ............... 330/85, 253, 258, 260, 330/294, 299

[56] References Cited

U.S. PATENT DOCUMENTS

| | | | |
|---|---|---|---|
| 4,232,271 | 11/1980 | Dobkin et al. | 330/258 |
| 4,626,795 | 12/1986 | Tanaka et al. | 330/257 |

FOREIGN PATENT DOCUMENTS

| | | |
|---|---|---|
| 0209334 | 7/1986 | European Pat. Off. |
| 0257345 | 7/1987 | European Pat. Off. |

OTHER PUBLICATIONS

EDN Electrical Design News, vol. 28, No. 16, Aug. 1983, pp. 133-145, Scott Wurcer, et al., "Instrumentation Amplifiers Solve Unusual Design Problems".

Electronics Letters, vol. 26, No. 8, Apr. 14, 1990, pp. 543-545, Z. Wang, "Wideband Class AB (push-pull) Current Amplifier in CMOS".

IEEE Journal of Solid-State Circuits, vol. 25, No. 1, Feb. 1990, pp. 173-182, R. K. Hester, et al., "Rail-to-Rail Common Mode Range & Nonlinear Capacitor Compensation".

Electronic Design, vol. 30, Jun. 10, 1982, pp. 177-186, L. Counts, et al., "Instrumentation Amplifier Nears Input Noise Floor".

*Primary Examiner*—James B. Mullins
*Attorney, Agent, or Firm*—Robert Groover

[57] ABSTRACT

An amplifier including first and second input transistors which are connected to respective first and second feedback amplification circuits associated with respective frequency-compensating capacitances. The second feedback amplification circuit has a two-stage structure and includes an internal compensating capacitance. The three frequency-compensating capacitances can have low values and can thus conveniently be integrated in the same chip as the amplifier. The amplifier can be used, in particular, as an interface between a zirconium-dioxide oxygen sensor and an electronic control unit which have different earth conductors.

20 Claims, 4 Drawing Sheets

INTEGRATED INSTRUMENTATION AMPLIFIER WITH INTEGRATED FREQUENCY-COMPENSATING CAPACITANCE

FIELD OF THE INVENTION

The present invention relates to integrated instrumentation amplifiers with differential input which operate with a single power supply.

More specifically, the invention relates to an integrated instrumentation amplifier with differential input, operating with a single supply having one terminal connected to a first ground conductor and able to operate with a common-mode input voltage which may assume values below the voltage range corresponding to the supply voltage.

Such an amplifier is used, for example, as an interface amplifier between a zirconium-dioxide oxygen sensor (a lambda probe) fitted to the catalytic converter of a motor vehicle with an internal combustion engine, and an electronic control unit which is physically remote from the converter. In this application, the oxygen sensor supplies a voltage signal which relates to a local ground conductor (the ground of the converter), and which may vary, typically between 0 and a maximum of about +1 V. Typically, the ground to which the sensor is connected is physically separate and distinct from that of the electronic control unit with which the interface amplifier is usually associated. A potential difference of the order of ±1 V may therefore develop between the ground of the sensor and the ground of the interface amplifier.

Since the connecting wires between the oxygen sensor and the electronic control unit are usually quite long, the interface amplifier must have a high CMRR value (common-mode rejection ratio) in order effectively to reject common-mode interference. It is also desirable for the amplifier to have a high PSRR (power-supply rejection ratio).

Zirconium dioxide oxygen sensors have quite high output impedances. An interface amplifier for use in connection with such a sensor must therefore have a high input impedance. The amplifier must also be able to output a signal which relates to its own ground with a dynamic range which is optimal for connection to an analog/digital converter and thus, for example, a range of from 0 to 4 V. The amplifier must therefore have a nominal gain of about 4.

STATE OF THE ART

Examples of amplifiers with differential input which operate with single power supplies and have high input impedances and high CMRR and PSRR values are the so-called "instrumentation amplifiers" of the type described in "A wide-band monolithic instrumentation amplifier" by Rudy J. Van de Plassche, IEEE J. Solid State Circuits, Vol. SC-10, pp. 424–431, Dec. 1975, and in "An Improved Monolithic Instrumentation Amplifier" by Paul Brokaw and Michael P. Timko, IEEE J. Solid State Circuits, Vol. SC-10, pp. 417–423, Dec. 1975, both of which are hereby incorporated by reference. These amplifiers cannot be used in connection with a zirconium-dioxide oxygen probe, however, since the minimum value of the common-mode voltage at their inputs is about +1 V relative to the earth as against the necessary −1 V.

A type of amplifier which is suitable for the application described above is described, however, in "Instrumentation Amplifier IC Designed for Oxygen Sensor Interface Requirements" by Bernard D. Miller and Lawrence R. Sample, IEEE J. Solid State Circuits Vol. SC-16. Dec. 1981, and in U.S. Pat. No. 4,232,271, both of which are hereby incorporated by reference.

The amplifier described in this U.S. patent in particular includes an input stage formed by the emitters of two bipolar transistors which can be brought to a potential below that of the ground because their respective collectors are kept at a reference potential which is higher than that of the ground, thus preventing the substrate diode from conducting. The desired high input impedance is achieved by appropriate biasing of the bipolar transistors. The differential voltage applied between the inputs is converted into a current which is then sent to an output resistor by means of a current-mirror circuit.

SUMMARY OF THE INVENTION

The present invention provides an integrated instrumentation amplifier with differential input and a single supply for connection to a lambda probe, the amplifier having frequency compensation without the need for external compensating capacitors but with the use of capacitances with low values which can therefore easily be integrated in the same chip as the amplifier.

BRIEF DESCRIPTION OF THE DRAWINGS

Further characteristics and advantages of the invention will become clear from the detailed description which follows with reference to the appended drawings, provided purely by way of non-limiting example, in which.

DETAILED DESCRIPTION OF THE INVENTION

Figure 1:
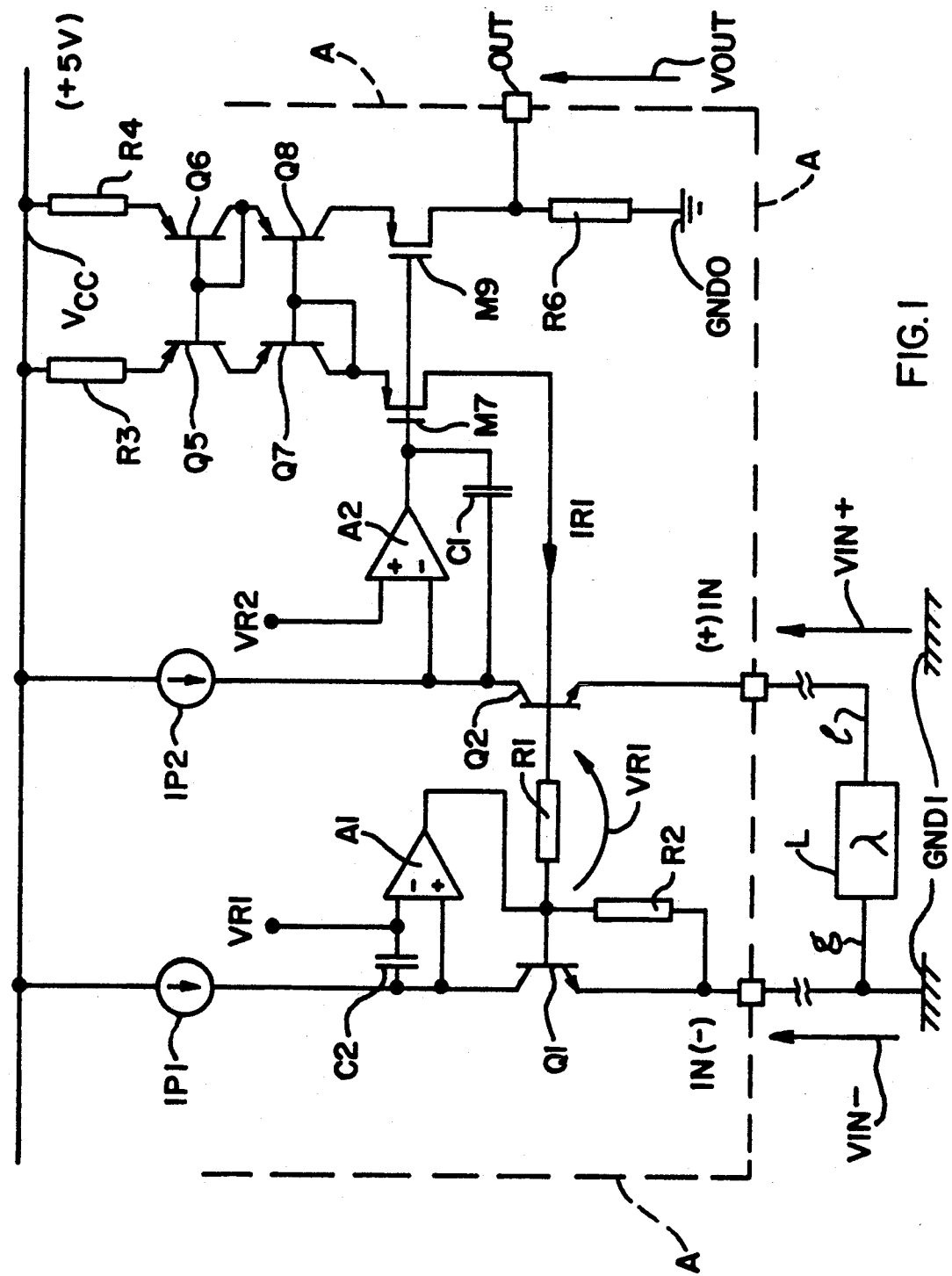
FIG. 1 is a circuit diagram of an amplifier according to the invention.

In FIG. 1, an amplifier according to the invention is generally indicated A.

The amplifier A has two input terminals IN− and IN+ and an output terminal OUT.

The terminals IN− and IN+ of the amplifier A are shown connected to the terminals g and l of a zirconium-dioxide oxygen sensor, indicated L. The terminal g of the sensor is connected to a local ground conductor GND1 which is physically separate and distinct from the ground conductor GND0 of the amplifier A. One pole of the single voltage supply $V_{cc}$ of the amplifier A is also connected to the latter ground conductor.

The amplifier includes two bipolar input transistors Q1 and Q2 which, in the embodiment illustrated, are of the npn type.

The emitters of Q1 and Q2 are connected to the terminals IN− and IN+, respectively.

A resistor R1 is connected between the bases of Q1 and Q2. A resistor R2 is connected between the base and the emitter of Q1.

Two generators, indicated IP1 and IP2 respectively, for generating constant-bias currents, are connected between the positive pole of the supply $V_{cc}$ and the collectors of Q1 and Q2.

A first amplifier, indicated A1, has an inverting input (−) connected to a reference voltage supply VR1 and a second, non-inverting input (+) connected to the collector of Q1. The output of A1 is connected to the base of Q1.

A second amplifier A2 has a first inverting input (−) connected to the collector of Q2. Its second, non-inverting input (+) is connected to a reference voltage supply VR2. Its output is connected to the gate of a MOSFET pass transistor M7. The drain of this latter transistor M7 is connected to the base of Q2.

The amplifier A1 keeps the collector of Q1 at the (positive) voltage VR1 relative to the ground GND0 and consequently the emitter of that transistor can fall to potentials below the potential of the ground conductor GND0. Similarly, the collector of Q2 is kept at the voltage VR2 relative to GND0 so that the emitter of that transistor can also fall below the potential of GND0.

The gate of M7 is connected to the gate of a further MOSFET pass transistor M9, the drain of which represents the output OUT of the entire amplifier A and is also connected to the ground conductor GND0 by means of a resistor R6.

The collectors of two pnp bipolar transistors, indicated Q7 and Q8, are connected respectively to the sources of M7 and of M9. The base of the transistor Q7 is connected to its emitter and to the base of Q8.

The emitters of Q7 and Q8 are connected to the collectors of two further bipolar pnp transistors, indicated Q5 and Q6. The base of the transistor Q6 is connected to its collector and to the base of Q5.

The emitters of Q5 and Q6 are connected to the positive pole of the voltage supply $V_{cc}$ by means of two resistors indicated R3 and R4, respectively.

The amplifier A operates substantially in the following manner.

The input transistors Q1 and Q2 are biased by the two constant-current generators IP1 and IP2. The base-emitter voltages of these transistors may thus be considered to be approximately constant. In these circumstances, the voltage produced across the resistor R1 corresponds to the potential difference between the inputs IN+ and IN−.

The voltage across the resistor R1 is thus:

$$VR1 = VIN, \text{ where } VIN = VIN(+) - VIN(-).$$

The current IR1 necessary to develop the voltage VR1 (IR1 = VR1/R1) in R1 is supplied by M7.

The transistors M7, M8 and Q5–Q8 and the resistors R3, R4 and R6 form a current-mirror circuit with "cascode"-type connections. If the ratio between the currents in the two branches of the current-mirror circuit is 1:1, the current, indicated IR6, flowing through R6 is equal to the current flowing through R1: IR1 = IR6.

The voltage VOUT between the output terminal OUT and the ground conductor GND0 is thus equal to:

$$VOUT = R6 \cdot IR1 = VIN \cdot R6/R1.$$

The output voltage VOUT is thus proportional to the differential input voltage VIN according to the ratio between the resistances of the resistors R6 and R1.

The amplifier A will now be considered from the point of view of frequency compensation.

Figure 2:
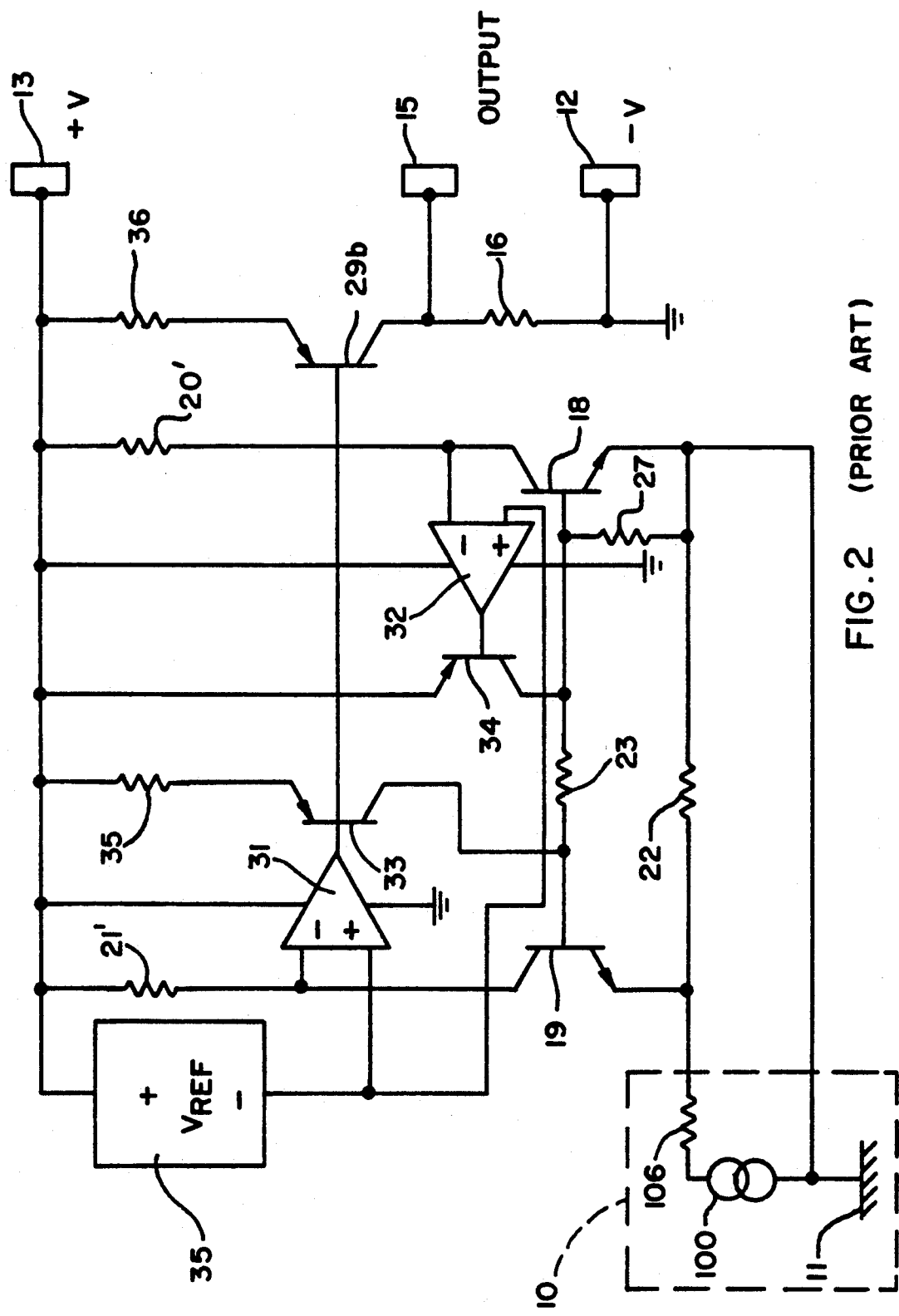
FIG. 2 is a circuit diagram which is derived from the diagram of FIG. 1, and is used for considerations relating to the stabilisation of the gain of a negative feedback loop of the amplifier according to the invention.
Figure 4:
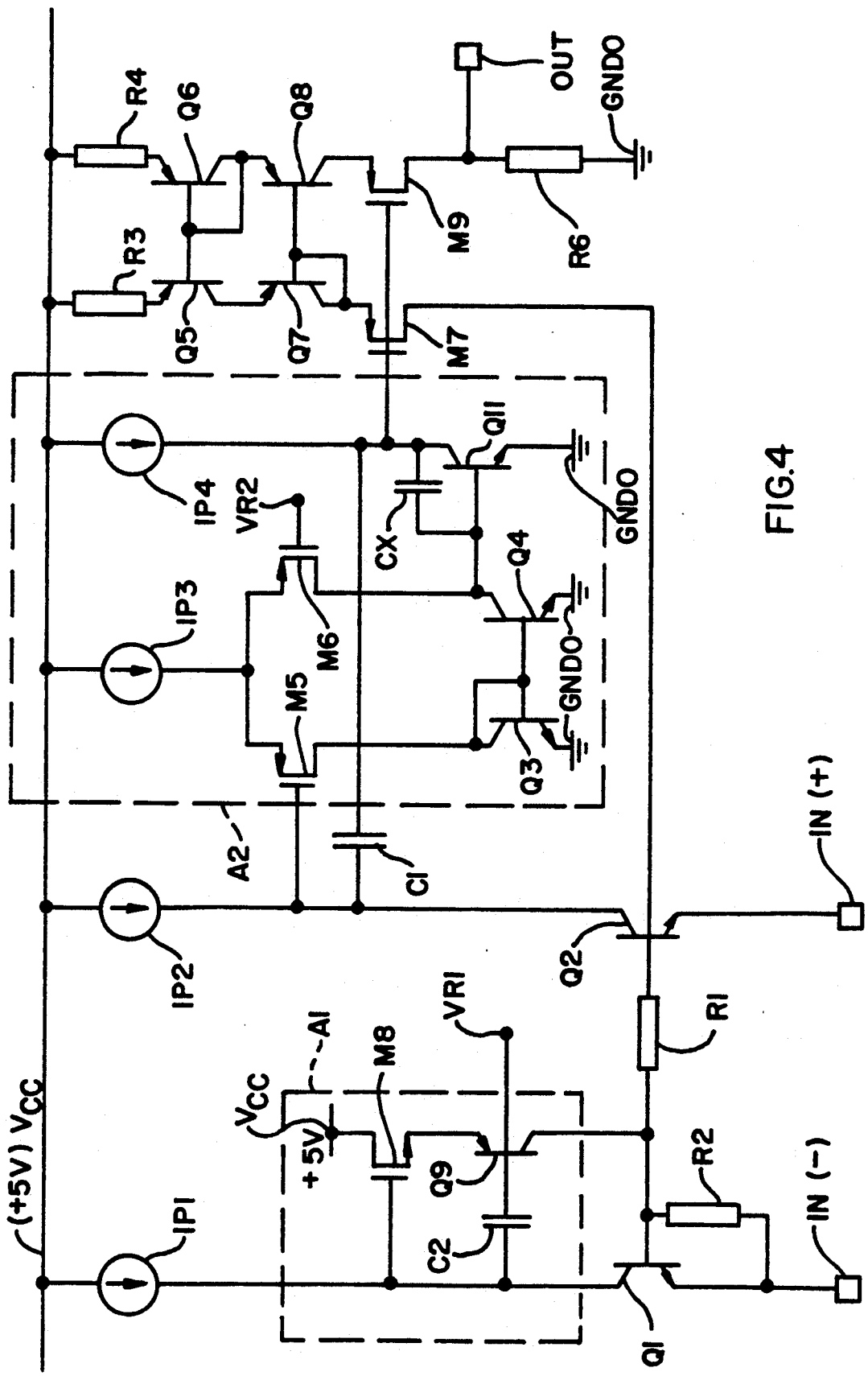
FIG. 4 is a detailed diagram of a preferred embodiment of the amplifier according to the invention.

As will become clearer from the following, according to the invention, the frequency compensation of the amplifier A can be achieved with the use of two capacitances integrated in the same chip as the amplifier and indicated C1 and C2 in FIGS. 1, 2 and 4, and by the formation of the amplifier A2 as a two-stage amplifier including a further integrated compensating capacitance, indicated CX in FIG. 4.

As can be seen in FIG. 1, the capacitance C1 is connected between the inverting input and the output of the amplifier A2.

The capacitance C2 is connected between the inverting input of A1 and the collector of Q1.

The capacitances C1 and C2 as well as the structure of A2 and the capacitance of CX are determined on the basis of the following considerations.

First of all, the amplifier A2 will be considered and it will be assumed that the amplifier A1 can be formed so as to be stable and to have a practically infinite bandwidth.

On this assumption, if the inputs IN+ and IN− are considered as short-circuited (as regards the alternating (a.c.) component), the voltage of the base of Q1 is essentially clamped (by A1) in relation to frequency variations, and therefore behaves as if it were connected to the ground (still as regards the a.c. component). In view of these considerations, and if the feedback loop between the output of A2 and the gate of M7 is opened, the circuit to be analysed for the purposes of stabilisation is that shown in FIG. 2.

According to the invention, the compensation of A2 is achieved by forming the amplifier as a conventional two-stage amplifier, for example, in the manner shown in FIG. 4, with an internal compensating capacitance CX (a Miller capacitance) and an external compensating capacitance C1.

In the embodiment shown in FIG. 4, the amplifier A2 includes a first, differential stage including two bipolar npn transistors Q3 and Q4 with their emitters connected to the earth conductor GND0, their bases connected to each other, and their collectors connected to the drains of two MOSFET transistors M5 and M6. The base and the collector of Q3 are connected to each other.

A current generator IP3 is connected between the positive terminal of the supply $V_{cc}$ and the sources of M5 and M6.

The gate of M5 is connected to the collector of Q2 and the gate of M6 is connected to the reference voltage supply VR2.

The collector of Q4 represents the output of the first stage of A2 and is connected to the base of an npn bipolar transistor Q11 which represents the second stage of A2. This transistor is biased by a current generator IP4 between the positive terminal of the supply $V_{cc}$ and the collector of the transistor.

The compensating capacitance CX is connected between the base and the collector of Q11.

The compensating capacitance C1 is connected between the collectors of Q2 and Q11.

With a two-stage structure of the type described above, it is quite easy to achieve frequency compensation in A2 so that its frequency-response curve (its open-loop gain GA2) has a dominant pole and a very large bandwidth (with a gain greater than unity). The amplifier A2 can thus easily be formed so that its gain GA2 has a frequency curve of the type shown in FIG. 3 with a fairly high gain-bandwidth product G.B. of the order of about 1 MHz with a high phase margin.

Figure 3:
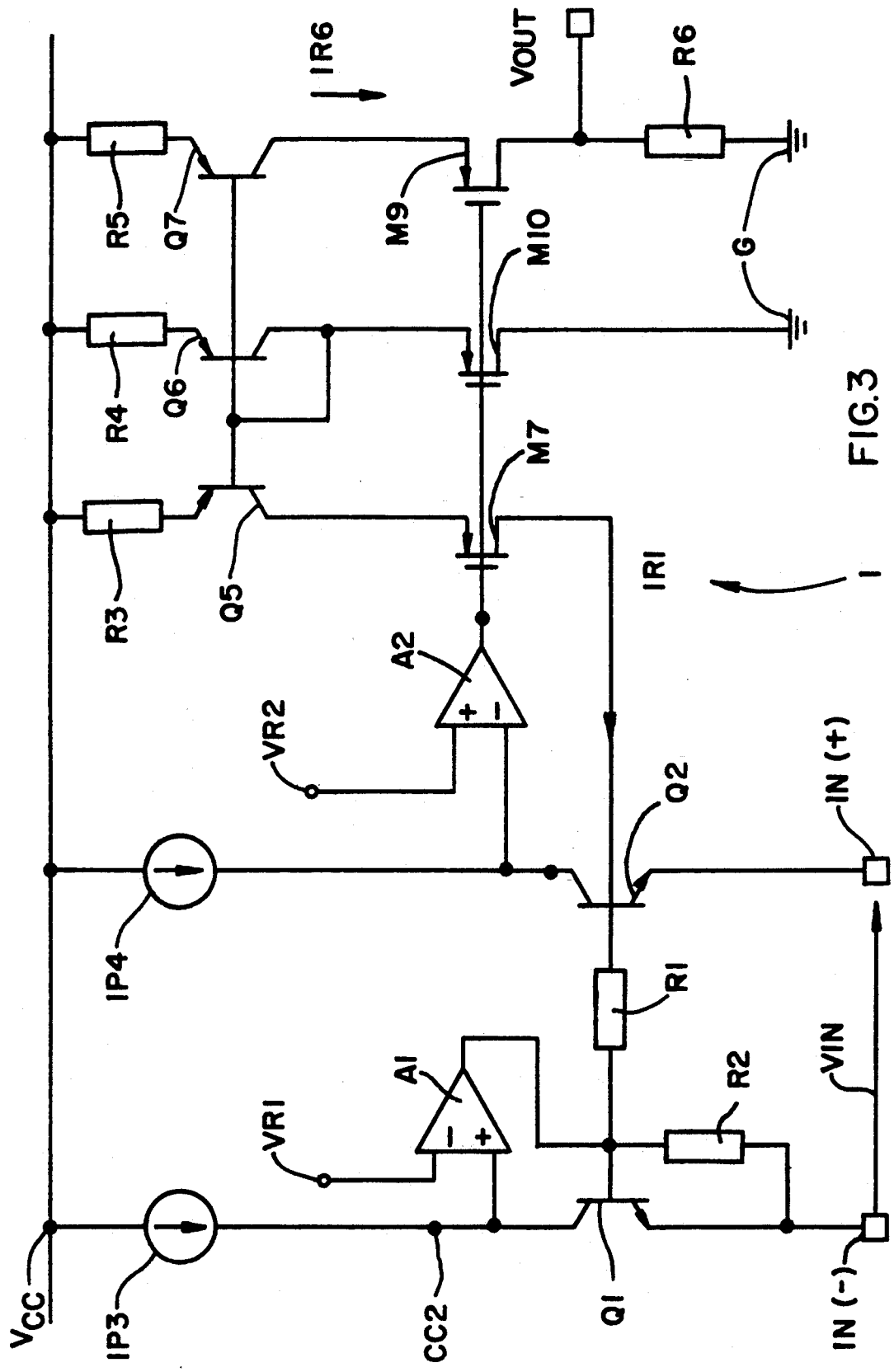
FIG. 3 is a graph showing a curve of the gain of an amplifier, as well as the modulus of the gain in a feedback loop of the amplifier according to the invention, expressed in dB on the ordinate, as functions of the frequency f which is shown on a logarithmic scale on the abscissa.

The addition of the compensating capacitance C1 means that, between the gate of M7 and the output of A2 (FIG. 2), there is a loop gain $A.\beta$ having a modulus $|\alpha\beta|$ and a frequency response corresponding to that of an integrator, as shown in FIG. 3.

The point at which the modulus of the loop gain crosses the 0 dB level depends on the transconductance (gm) between the collector of Q2 and the output of A2 (FIG. 2). Since the transconductance has a substantially flat frequency curve up to values of the order of a few MHz (for example, up to about 8 MHz), the product of the gain and the maximum total bandwidth of the loop gain A can be expressed as:

$$G \cdot B_{totmax} = (g_m)_{max} / 2\pi \cdot C1.$$

Naturally, the maximum value of the transconductance $g_m$ occurs when the differential input voltage is at its maximum (for example, +1 V) and the transconductance is zero when the differential input voltage is zero.

The capacitance C1 is therefore selected so that when the transconductance is at its maximum value, the product $G \cdot B_{totmax}$ is less than (or at most equal to) the bandwidth of the amplifier A2 and, for example, has a value of 300 KHz, as shown in FIG. 3. This ensures that A2 actually behaves like an integrator.

As the differential input voltage GM decreases, the transconductance $g_m$ decreases and the product $G \cdot B_{tot}$ thus also decreases, as indicated by the curve $|A.\beta|'$ of FIG. 3; the amplifier nevertheless remains stable since, when the curve of the modulus of the loop gain crosses the 0 dB level, it still has a slope of 20 dB/decade. The gain-bandwidth product $G \cdot B_{tot}$ is thus in any case of the order of a few hundred hertz which is more than satisfactory, since the signal of the lambda probe typically has a frequency bandwidth of less than 15 Hz.

The amplifier A1 can now be taken into consideration again. According to the assumptions made above, this amplifier must keep the base voltage of Q1 constant with changes in frequency. For this purpose, it suffices for A1 to have a bandwidth (with a gain greater than unity) greater than that of the loop gain A. and hence greater than $G \cdot B_{totmax}$. The amplifier A1 can therefore be formed so as to have a gain-bandwidth product G·B(A1) of about 4 MHz.

Since the maximum voltage at the input IN— is only about +1 V, the amplifier A1 can be constituted by the simple structure shown in FIG. 4, with a pnp bipolar transistor Q9 with its collector connected to the base of Q1, its emitter connected to the source of a MOSFET transistor M8 and its base connected to the capacitance C2 and to the reference voltage supply VR1. The drain of the MOSFET M8 is connected to the positive pole of the supply voltage $V_{cc}$ and its gate is connected to the collector of Q1.

In the embodiment shown in FIG. 4, the amplifier A1 has a high input impedance. Moreover, the transistor M8 prevents the collector of Q1 from absorbing current, so that no offset voltage is introduced to the inputs IN+ and IN—. Since M8 is a MOSFET transistor, the CMRR value is increased because, by virtue of the Early effect due to Q9, a variation in the current in Q9 and M8 causes no variation in the bias current of Q1 (which is determined by the generator IP1) and there is therefore no variation in the current in the current-mirror circuit and consequently no change in the output voltage.

As regards the amplifier A2, it can be seen that this also has a high input impedance with a zero-input bias current, so that the introduction of offset voltages at the inputs IN+ and IN— is prevented.

The amplifier according to the invention described above has optimal frequency compensation and high CMRR and PSRR values, allows the common-mode inputs to be displaced by about +1 V relative to the ground and, at the same time, can accept a maximum difference of about 1 V between the inputs IN+ and IN—, with a single voltage supply. The amplifier is stabilised without the use of external capacitances, so that frequency-compensation is ensured in all operating conditions, particularly as regards the amplitude of the input voltage.

Naturally, the principle of the invention remaining the same, the forms of embodiment and details of construction may be varied widely with respect to those described and illustrated purely by way of non-limiting example, without thereby departing from the scope of the present invention.

We claim:

1. An integrated circuit instrumentation amplifier, comprising:

first and second input transistors, the bases of which are interconnected by a resistor and the emitters of which are connected to provide first and second differential input terminals connectible to first and second terminals of a signal source;

current-generating means connected between a power supply connection and the collectors of said first and second transistors, first and second feedback amplifiers comprising
   respective first inputs connected to said collectors of said first and second transistors respectively and respective second inputs connected to respective reference voltage supplies, and respective outputs connected to said bases of said transistors, to form negative feedback loops in order to keep said collectors of said transistors at predetermined potentials greater than ground, and circuitry connected to supply a signal indicative of the current flowing from the second feedback amplifier towards and through said resistor;

wherein a first integrated compensating capacitance associated with said first amplifier is connected between said collector of said first transistor and said second input of said first amplifier, and has a value such that the gain of said first amplifier is greater than unity up to at least a predetermined frequency, and wherein said second amplifier includes two amplification stages in cascade, including a bipolar output transistor with a second integrated compensating capacitance connected between the base and collector thereof, said second integrated compensating capacitance having a value such that said second amplifier is stable and has a gain greater than unity, up to a frequency greater than said predetermined frequency, a third integrated compensating capacitance being connected between said first input and said output of said second amplifier and having a value such that said second amplifier behaves substantially like an integrator in relation to frequency.

2. An amplifier according to claim 1, wherein said first amplifier includes a field-effect transistor with its gate connected to the collector of said first input transistor, its drain connected to said supply connection and its source connected to the emitter of a bipolar transistor, the base of which is connected to said first integrated compensating capacitance and to a reference voltage supply, and the collector of which is connected to the base of said first input transistor.

3. An amplifier according to claim 1 wherein said second feedback amplifier includes:

a first stage with first and second field-effect transistors of which the respective sources are connected to a bias-current generator and the drains are connected to the collectors of first and second bipolar transistors respectively, the bases of said first and second bipolar transistors being connected to ground, the base and the collector of said first bipolar transistor being connected to each other, and the respective gates of said first and second field-effect transistors being connected to the collector of said second input transistor and to a voltage reference supply, respectively, and a second amplification stage including said bipolar output transistor, said base thereof being connected to said collector of said second bipolar transistor, the collector of said bipolar output transistor constituting the output of said second feed-back amplifier.

4. The integrated circuit of claim 1, wherein said second capacitor consists essentially of a Miller capacitance.

5. The integrated circuit of claim 1, wherein said input transistors are NPN transistors.

6. The integrated circuit of claim 1, further comprising an additional resistor connected between said base and said emitter of said first transistor.

7. An integrated circuit instrumentation amplifier, comprising:

a first bipolar transistor, and a first current generator connected to provide a substantially constant current to the collector of said first transistor;

a second bipolar transistor, and a second current generator connected to provide a substantially constant current to the collector of said second transistor;

said first and second transistors having respective emitters thereof connected to provide input terminals, and respective bases thereof connected together through a first resistor;

a first differential amplifier, operatively connected to said collector and base of said first transistor and to a first reference voltage connection, in such relation that said collector of said first transistor is driven toward a respective predetermined voltage; said first amplifier including a negative feedback path having a first capacitor in series therein;

a second differential amplifier, having inputs connected to said collector of said second transistor and to a second reference voltage connection, and having an output connected to drive a first pass transistor which provides current to said base of said second transistor, with a polarity which drives said collector of said second transistor toward a respective predetermined voltage; said second amplifier including multiple stages, including an output stage which includes a second capacitor therein; said second amplifier including an overall negative feedback path having a third capacitor in series therein; and a current mirror, connected to mirror the current drawn by said first pass transistor into a second pass transistor which has a control terminal connected in common with that of said first pass transistor and which is operatively connected to provide an output signal.

8. The integrated circuit of claim 7, further comprising an output terminal which is connected between said second pass transistor and a second resistor.

9. The integrated circuit of claim 7, wherein said second capacitor consists essentially of a Miller capacitance.

10. The integrated circuit of claim 7, wherein said input transistors are NPN transistors, and each said pass transistor is a P-channel field-effect transistor.

11. The integrated circuit of claim 7, wherein said input transistors are NPN transistors, and each said pass transistor is a P-channel field-effect transistor, and said current mirror comprises PNP bipolar transistors.

12. The integrated circuit of claim 7, further comprising an additional resistor connected between said base and said emitter of said first transistor.

13. The integrated circuit of claim 7, wherein said current mirror comprises bipolar transistors which are of opposite type to said input transistors.

14. The integrated circuit of claim 7, wherein said current mirror consists essentially of comprises four bipolar transistors which are of opposite type to said input transistors.

15. An integrated circuit instrumentation amplifier, comprising:

a first NPN bipolar transistor, and a first current generator connected to source a substantially constant current to the collector of said first transistor;

said second NPN bipolar transistor, and a second current generator connected to source a substantially constant current to the collector of said second transistor;

said first and second transistors having respective emitters thereof connected to provide input terminals, and respective bases thereof connected together through a first resistor;

a first differential amplifier, having inputs operatively connected to said collector of said first transistor through a first capacitor, and to a first reference voltage connection, and having an output operatively connected to said base of said first transistor;

a second differential amplifier, having a first input connected to said collector of said second transistor and a second input connected to a second reference voltage connection, and having an output connected to the gate of a first field-effect pass transistor which provides current to said base of said second transistor; said second amplifier including an output stage which includes a second capacitor therein; said second amplifier including a third capacitor connected between said output and said first input thereof; and a current mirror, connected to mirror the current drawn by said first pass transistor into a second field-effect pass transistor which has a control terminal connected in common with that of said first pass transistor and which is operatively connected to provide an output signal.

16. The integrated circuit of claim 15, further comprising an output terminal which is connected to the drain of said second pass transistor, and a second resistor which is connected between said drain of said second pass transistor and ground.

17. The integrated circuit of claim 15, wherein said second capacitor consists essentially of a Miller capacitance.

18. The integrated circuit of claim 15, wherein each said pass transistor is a P-channel field-effect transistor.

19. The integrated circuit of claim 15, wherein said current mirror comprises PNP bipolar transistors.

20. The integrated circuit of claim 15, wherein said current mirror consists essentially of comprises four PNP bipolar transistors.

* * * * *

UNITED STATES PATENT AND TRADEMARK OFFICE
CERTIFICATE OF CORRECTION

PATENT NO. : 5,258,723
DATED : November 2, 1993
INVENTOR(S) : Mazzucco et al.

It is certified that error appears in the above-identified patent and that said Letters Patent is hereby corrected as shown below:

Title page, item [73], insert--
Assignees: SGS-Thomson Microelectronics, S.r.l.
Agrate Brianza (Milano), Italy Marelli Autronica, S.p.A.
Milano, Italy--.

Signed and Sealed this

Thirtieth Day of August, 1994

BRUCE LEHMAN

*Attest:*

*Attesting Officer*    *Commissioner of Patents and Trademarks*